United States Patent
Kitazawa

(10) Patent No.: US 10,689,515 B2
(45) Date of Patent: Jun. 23, 2020

(54) SILICONE COMPOSITION BASED ON BOTH CONDENSATION/CURING REACTION AND ORGANIC-PEROXIDE CURING REACTION

(71) Applicant: SHIN-ETSU CHEMICAL CO., LTD., Tokyo (JP)

(72) Inventor: Keita Kitazawa, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 62 days.

(21) Appl. No.: 16/066,961

(22) PCT Filed: Dec. 20, 2016

(86) PCT No.: PCT/JP2016/087868
§ 371 (c)(1),
(2) Date: Jun. 28, 2018

(87) PCT Pub. No.: WO2017/119277
PCT Pub. Date: Jul. 13, 2017

(65) Prior Publication Data
US 2019/0010294 A1    Jan. 10, 2019

(30) Foreign Application Priority Data

Jan. 7, 2016 (JP) .................................. 2016-001935

(51) Int. Cl.
| | | |
|---|---|---|
| C08L 83/06 | (2006.01) | |
| C08K 3/22 | (2006.01) | |
| C09K 3/10 | (2006.01) | |
| C08K 5/541 | (2006.01) | |
| C08G 77/08 | (2006.01) | |
| C08G 77/18 | (2006.01) | |
| C08K 5/098 | (2006.01) | |
| C08K 5/14 | (2006.01) | |
| C08J 3/24 | (2006.01) | |
| H01L 23/36 | (2006.01) | |

(52) U.S. Cl.
CPC .............. *C08L 83/06* (2013.01); *C08G 77/08* (2013.01); *C08G 77/18* (2013.01); *C08J 3/246* (2013.01); *C08K 3/22* (2013.01); *C08K 5/098* (2013.01); *C08K 5/14* (2013.01); *C08K 5/541* (2013.01); *C09K 3/1018* (2013.01); *C08K 2003/2227* (2013.01); *C08K 2201/001* (2013.01); *H01L 23/36* (2013.01)

(58) Field of Classification Search
CPC ...................................................... C08G 77/08
USPC ........................................ 528/17, 18, 21, 24
See application file for complete search history.

(56) References Cited

U.S. PATENT DOCUMENTS

| | | | |
|---|---|---|---|
| 4,777,205 A | 10/1988 | La Scola et al. | |
| 4,921,926 A * | 5/1990 | Motegi | ................... C08L 83/04 522/148 |
| 5,569,684 A | 10/1996 | Okami et al. | |
| 9,994,754 B2 * | 6/2018 | Clough | ................ C08K 5/5397 |
| 2003/0049466 A1 | 3/2003 | Yamada et al. | |
| 2003/0195124 A1 | 10/2003 | Yamada et al. | |
| 2004/0242762 A1 | 12/2004 | Horikoshi et al. | |
| 2006/0079634 A1 * | 4/2006 | Horikoshi | ............... C08L 83/04 524/588 |
| 2008/0096030 A1 | 4/2008 | Horikoshi et al. | |
| 2014/0094554 A1 | 4/2014 | Matsumoto et al. | |
| 2015/0148273 A1 * | 5/2015 | Matsumoto | ............. C08L 83/04 508/139 |
| 2015/0232718 A1 * | 8/2015 | Wu | ........................ C08L 71/00 428/41.8 |

FOREIGN PATENT DOCUMENTS

| | | |
|---|---|---|
| JP | 64-65172 A | 3/1989 |
| JP | 1-132664 A | 5/1989 |
| JP | 7-292251 A | 11/1995 |
| JP | 3580366 B2 | 10/2004 |
| JP | 2004-352947 A | 12/2004 |
| JP | 4130091 B2 | 8/2008 |
| JP | 2010-132720 A | 6/2010 |
| JP | 4787128 B2 | 10/2011 |
| JP | 2015-110792 A | 6/2015 |
| JP | 5733087 B2 | 6/2015 |
| JP | 2016-125004 A | 7/2016 |

OTHER PUBLICATIONS

International Search Report for PCT/JP2016/087868 (PCT/ISA/2105 dated Jan. 24, 2017.
Written Opinion of the International Searching Authority for PCT/JP2016/087868 PCT/ISA/210) dated Jan. 24, 2017.

* cited by examiner

*Primary Examiner* — Marc S Zimmer
(74) *Attorney, Agent, or Firm* — Birch, Stewart, Kolasch & Birch, LLP

(57) ABSTRACT

Provided is a thermally conductive silicone composition which need not be stored with cooling or freezing and needs neither a heating nor a cooling step during mounting to bring about a high production efficiency and which gives cured objects that, during heating or cold/heat cycling, can be inhibited from suffering a change in hardness or a deterioration caused by cracking or dislocation. The composition includes a conventional condensation-curable silicone composition, and is cured by a combination of the condensation and curing with an organic peroxide.

19 Claims, No Drawings and organic peroxide curing reaction. More particularly, it relates to a condensation-curable silicone composition which forms a highly heat conductive silicone grease. The invention further relates to a heat-conductive silicone composition relying on both condensation curing reaction and organic peroxide curing reaction, in which the concurrent use of organic peroxide is successful in improving deep section cure and preventing deterioration of a cured product owing to hardness changes and cracking/slipping upon heat exposure and thermal cycling.

BACKGROUND ART

In the electric/electronic, transportation, and other fields, more than ever electronic components or parts are now incorporated for precise control of energy consumption. In the transportation field, for example, the transition from gasoline-powered vehicles to hybrid vehicles, plug-in hybrid vehicles, and electric vehicles poses a need to mount electronic components or parts such as motors, inverters, and batteries, which have been unnecessary for the gasoline-powered vehicles. Also in the body-related mechanisms such as engine control, power train, and air conditioner control mechanisms, more advanced control functions are required and more control systems are necessary. Thus, the number of electronic control units (ECUs) loaded is increasing every year. The number of electronic components built in such ECUs is also increasing. Accordingly, heat-conductive silicone compositions are now indispensable to remove heat from these heat-generating electronic components or parts and conduct the heat to cooling units efficiently.

Since a larger number of electronic components or parts must be recently installed in a limited space, they are placed under widely varying conditions (e.g., temperature and mount angle). For example, in many cases, heat-generating electronic components or parts and heatsinks are not placed horizontally, and heat-conductive materials connecting them are mounted in certain inclination. In such service environment, a one-part addition type heat-conductive silicone composition is sometimes used in order to prevent the heat-conductive material from slipping and falling out of the space between the heat-generating parts and the heatsinks (Patent Document 1: JP 3580366). That is, the heat-conductive material, after heat curing, is prevented from slipping and falling out of the space between the heat-generating parts and the heatsinks. As a result, heat dissipating properties are maintained for a long term. However, this one-part addition type heat-conductive silicone composition suffers from several problems. For example, the heat-conductive silicone composition must be refrigerated or frozen during storage and thawed prior to use. When the one-part addition type heat-conductive silicone composition is applied in place, it must be heated and cooled. Thus the manufacturing system using the material must be equipped with a heating/cooling oven. The heating and cooling steps take a long time, leading to a reduction of manufacturing efficiency. From the standpoint of energy efficiency, the heating step is not considered efficient because not only the heat-conductive material, but also the applied part must be heated in entirety.

There is also a problem that the heat-conductive material is under-cured if metal cutting fluid containing a curing inhibitor such as an amine compound is left on the coating surface. It is an additional problem that the heat-conductive material increases its hardness with the lapse of time due to excessive addition reaction by the heat release from heat-generating parts, which causes stresses to the installed component.

To save time and labor for storage/thaw management and heating/cooling steps in application of the one-part addition type heat-conductive silicone composition and to alleviate concerns about cure inhibition, a one-part addition type heat-conductive material which has been heat-crosslinked during its preparation is already proposed (Patent Document 2: JP 4130091). This heat-conductive silicone grease composition has overcome the above-mentioned problems, but a new problem arises as the tradeoff that the material is too viscous to coat, and heavy loading of heat-conductive filler is difficult due to the high viscosity of the base polymer. The above-mentioned problem of hardness increase with time is left yet unsolved.

On the other hand, there are proposed condensation-curable heat-conductive silicone compositions which have a low viscosity at the initial, which are coated and cured or thickened with airborne moisture in a room temperature environment to prevent them from slipping and falling out of the space between the heat-generating parts and the heatsinks, and which allow for room temperature storage (Patent Documents 3 to 5: JP-A 2004-352947, JP 4787128, and JP 5733087). These materials are useful in that refrigeration or freezing is not required during storage, heating/cooling steps are not required in application, and manufacturing efficiency is high. However, these materials commonly have the drawback of inferior deep section cure because their curing system utilizes airborne moisture for curing. This results in the problem that a cured product of the composition experiences deterioration such as cracking and slipping upon application of thermal loads during heat exposure or thermal cycling, detracting from heat dissipating properties. In addition, since excessive condensation reaction proceeds with airborne moisture, the hardness increase with time is still the outstanding problem for this curing system.

For the purposes of preventing deterioration such as cracking and slipping and alleviating hardness increase with time in cured products of condensation-curable heat-conductive silicone compositions, an improvement in deep section cure is considered a common countermeasure. In condensation-curable heat-conductive silicone compositions, a catalyst is generally added to promote condensation curing. However, if large amounts of catalysts are added or catalysts having strong catalytic activity are used, with the extra intention to promote deep section cure, then the composition may be considerably exacerbated in shelf stability and handling. It is desired to establish a condensation-curing system which is effective for improving deep section cure without sacrificing shelf stability and handling.

PRIOR ART DOCUMENTS

Patent Documents

Patent Document 1: JP 3580366
Patent Document 2: JP 4130091
Patent Document 3: JP-A 2004-352947

Patent Document 4: JP 4787128
Patent Document 5: JP 5733087

SUMMARY OF INVENTION

Technical Problem

An object of the invention, which has been made under the above circumstances, is to provide a heat-conductive silicone composition which has an increased manufacturing efficiency because of an eliminated need for refrigeration or freezing during storage and an eliminated need for heating/cooling steps in application, and can prevent a cured product from deterioration due to hardness changes and cracking/slipping during heat exposure and thermal cycling.

Solution to Problem

Making extensive investigations to attain the above object, the inventor has found that by combining a conventional condensation-curable silicone composition with organic peroxide curing using organic peroxides in a curing step, the composition is effectively improved in deep section cure without sacrificing shelf stability and handling. The invention is predicated on this finding.

Accordingly, the present invention provides a silicone composition as defined below.

[1] A silicone composition relying on both condensation curing reaction and organic peroxide curing reaction, comprising as essential components, (A) 100 parts by weight of an organopolysiloxane capped with hydroxyl at both ends and represented by the general formula (1):

[Chem. 1]

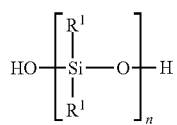
(1)

wherein $R^1$ is each independently an unsubstituted or halogen or cyano-substituted $C_1$-$C_5$ alkyl or $C_6$-$C_8$ aryl group, and n is such a number that the organopolysiloxane of formula (1) may have a viscosity at 25° C. of the value defined below, the organopolysiloxane having a viscosity at 25° C. of 0.1 to 1,000 Pa s, (B) 1 to 40 parts by weight of at least one compound selected from a silane compound represented by the general formula (2):

$$R^2{}_a\text{—SiX}_{(4-a)} \qquad (2)$$

wherein $R^2$ is an unsubstituted or halogen or cyano-substituted $C_1$-$C_3$ alkyl, vinyl, or phenyl group, X is a hydrolyzable group, and a is 0 or 1, a (partial) hydrolysate and a (partial) hydrolytic condensate thereof, (C) 0.01 to 20 parts by weight of a condensation catalyst selected from alkyltin ester compounds, titanic acid esters, titanium chelate compounds, organozinc compounds, organoiron compounds, organocobalt compounds, organomanganese compounds, organoaluminum compounds, hexylamine, dodecylamine phosphate, quaternary ammonium salts, alkali metal salts of lower fatty acids, dialkylhydroxylamines, and guanidyl-containing silanes and siloxanes, (D) 0.01 to 10 parts by weight of an organic peroxide selected from peroxy ketals, hydroperoxides, dialkyl peroxides, diacyl peroxides, peroxy esters, and peroxy dicarbonates, and (E) 100 to 8,000 parts by weight of a heat-conductive filler having a thermal conductivity of at least 10 W/m-K.

[2] The silicone composition of [1], further comprising (F) an organopolysiloxane represented by the general formula (3):

[Chem. 2]

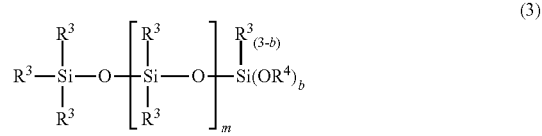
(3)

wherein $R^3$ is each independently an unsubstituted or halogen or cyano-substituted monovalent hydrocarbon group, $R^4$ is each independently an alkyl, alkoxyalkyl, alkenyl, or acyl group, m is an integer of 2 to 100, and b is an integer of 1 to 3, in an amount of 1 to 400 parts by weight per 100 parts by weight of component (A).

[3] The silicone composition of [1] or [2], further comprising (G) at least one compound selected from a silane compound having a group bonded to a silicon atom via a carbon atom and selected from the group consisting of an amino, epoxy, mercapto, acryloyl, and methacryloyl group, and a silicon-bonded hydrolyzable group and a partial hydrolytic condensate thereof, in an amount of 0.01 to 30 parts by weight per 100 parts by weight of component (A).

Advantageous Effects of Invention

The silicone composition of the invention satisfies all the requirements including "an eliminated need for refrigeration or freezing during storage," "an eliminated need for heating/cooling steps in application," and "to prevent a cured product from deterioration due to hardness changes and cracking/slipping during heat exposure", which are difficult to clear in the prior art. The silicone composition thus finds use in a wide variety of fields requiring heat dissipation and heat resistance such as electric/electronic and transportation fields.

DESCRIPTION OF EMBODIMENTS

[Component (A)]

Component (A) which is a base polymer (or main agent) of the inventive silicone composition is an organopolysiloxane capped with hydroxyl at both ends, represented by the general formula (1):

[Chem. 3]

(1)

wherein $R^1$ is each independently an unsubstituted or halogen or cyano-substituted $C_1$-$C_5$ alkyl or $C_6$-$C_8$ aryl group, and n is such a number that the organopolysiloxane of formula (1) may have a viscosity at 25° C. of the value defined below, the organopolysiloxane having a viscosity at 25° C. of 0.1 to 1,000 Pa s.

Examples of $R^1$ include alkyl groups such as methyl, ethyl, propyl, butyl, pentyl, hexyl, and heptyl; aryl groups such as phenyl and tolyl; and halogen or cyano-substituted forms of the foregoing alkyl or aryl groups in which some or all hydrogen atoms are substituted by halogen atoms (e.g., chloro, fluoro, or bromo) or cyano groups, such as chloromethyl, 3-chloropropyl, trifluoromethyl, and cyanoethyl. These groups may be used alone or in combination of two or more.

The subscript n is such a number that the organopolysiloxane of formula (1) may have a viscosity at 25° C. of 0.1 to 1,000 Pa-s, preferably 0.3 to 100 Pa-s.

Component (A) has a viscosity at 25° C. of 0.1 to 1,000 Pa-s, preferably 0.3 to 100 Pa s, and more preferably 0.5 to 50 Pas. A viscosity of less than 0.1 Pas leads to slow curing. With a viscosity in excess of 1,000 Pa s, a silicone composition becomes too viscous to coat. It is noted that the viscosity is measured by a rotational viscometer (the same holds true, hereinafter).

[Component (B)]

Component (B) is at least one compound selected from a silane compound represented by the general formula (2), a (partial) hydrolysate, and a (partial) hydrolytic condensate thereof.

$$R^2_a\text{-SiX}_{(4-a)} \qquad (2)$$

Herein $R^2$ is an unsubstituted or halogen or cyano-substituted $C_1$-$C_3$ alkyl, vinyl, or phenyl group, X is a hydrolyzable group, and a is 0 or 1. The compounds may be used alone or in combination of two or more. Component (B) serves as a crosslinking agent in the silicone composition.

In formula (2), $R^2$ is an unsubstituted or halogen or cyano-substituted $C_1$-$C_3$ alkyl (e.g., methyl, ethyl, or propyl), vinyl, or phenyl group.

X is a hydrolyzable group, examples of which include alkoxy, alkoxyalkoxy, alkenyloxy, ketoxime, acyloxy, amino, amide, and aminoxy groups. Alkoxy and alkoxyalkoxy groups may be halogen-substituted groups and examples include methoxy, ethoxy, isopropoxy, butoxy, β-chloroethoxy, 2,2,2-trifluoroethoxy, 6-chlorobutoxy, and methoxyethoxy. An exemplary alkenyloxy group is isopropenoxy. Examples of the ketoxime group include dimethylketoxime, methylethylketoxime, and diethylketoxime. Examples of the acyloxy group include acetoxy and propionyloxy. Examples of the amino group include dimethylamino, diethylamino, n-butylamino, and cyclohexylamino. Examples of the amide group include N-methylacetamide, N-ethylacetamide, N-butylacetamide, and N-cyclohexylacetamide. Examples of the aminoxy group include N,N-dimethylaminoxy and N,N-diethylaminoxy. More preferably X is an alkenyloxy group. The subscript a is 0 or 1.

Illustrative examples of the silane compound and the (partial) hydrolysate or (partial) hydrolytic condensate thereof include alkoxysilanes such as tetramethoxysilane, tetraethoxysilane, methyltrimethoxysilane, ethyltrimethoxysilane, vinyltrimethoxysilane, 3,3,3-trifluoropropyltrimethoxysilane, β-cyanoethyltrimethoxysilane, tetraisopropoxysilane, tetrabutoxysilane, phenyltrimethoxysilane, tetra(β-chloroethoxy)silane, tetra(2,2,2-trifluoroethoxy)silane, propyltris(6-chlorobutoxy)silane, and methyltris(methoxyethoxy)silane; alkoxysiloxanes such as ethylpolysilicate and dimethyltetramethoxydisiloxane; ketoximesilanes such as methyltris(methylethylketoxime)silane, vinyltris(methylethylketoxime)silane, phenyltris(methylethylketoxime)silane, methyltris(diethylketoxime)silane, and tetra(methylethylketoxime)silane; aminosilanes such as methyltris(cyclohexylamino)silane and vinyltris(n-butylamino)silane; amidesilanes such as methyltris(N-methylacetamide)silane, methyltris(N-butylacetamide)silane, and methyltris(N-cyclohexylacetamide)silane; aminoxysilanes such as methyltris(N,N-diethylaminoxy)silane; alkenyloxysilanes such as methyltri(isopropenoxy)silane, vinyltri(isopropenoxy)silane, and phenyltri(isopropenoxy)silane; and acyloxysilanes such as methyltriacetoxysilane and vinyltriacetoxysilane.

Component (B) is used in an amount of 1 to 40 parts by weight, preferably 2 to 30 parts by weight, relative to 100 parts by weight of component (A). A composition containing less than 1 part by weight of component (B) does not cure whereas more than 40 parts by weight of component (B) rather retards cure.

[Component (C)]

Component (C) is a condensation catalyst selected from alkyltin ester compounds, titanic acid esters, titanium chelate compounds, organozinc compounds, organoiron compounds, organocobalt compounds, organomanganese compounds, organoaluminum compounds, hexylamine, dodecylamine phosphate, quaternary ammonium salts, alkali metal salts of lower fatty acids, dialkylhydroxylamines, and guanidyl-containing silanes and siloxanes. It is a condensation catalyst for curing the inventive silicone composition. The catalysts may be used alone or in combination of two or more.

Illustrative examples of the catalyst include alkyltin ester compounds such as dibutyltin diacetate, dibutyltin dilaurate, and dibutyltin dioctoat; titanic acid esters such as tetraisopropoxytitanium, tetra-n-butoxytitanium, tetrakis(2-ethylhexoxy)titanium, dipropoxybis(acetylacetona)titanium, and titanium isopropoxyoctylene glycol; titanium chelate compounds such as diisopropoxybis(ethylacetoacetate)titanium, diisopropoxybis(methyl acetoacetate)titanium, diisopropoxybis(acetylacetonate)titanium, dibutoxybis(ethylacetoacetonate)titanium, and dimethoxybis(ethylacetoacetonate)titanium; organometallic compounds of zinc, iron, cobalt, manganese, or aluminium such as zinc naphthenate, zinc stearate, zinc 2-ethyloctoate, iron 2-ethylhexoate, cobalt 2-ethylhexoate, manganese 2-ethylhexoate, cobalt naphthenate, and alkoxyaluminum compounds; 3-aminopropyltriethoxysilane; hexylamine; dodecylamine phosphate; quaternary ammonium salts such as benzyltriethylammonium acetate; alkali metal salts of lower fatty acids such as potassium acetate, sodium acetate, and lithium oxalate; dialkylhydroxylamines such as dimethylhydroxylamine and diethylhydroxylamine; and guanidyl-containing silanes or siloxanes such as tetramethylguanidylpropyltrimethoxysilane, tetramethylguanidylpropylmethyldimethoxysilane, and tetramethylguanidylpropyltris(trimethylsiloxy)silane. Inter alia, guanidyl-containing silanes or siloxanes such as tetramethylguanidylpropyltrimethoxysilane, tetramethylguanidylpropylmethyldimethoxysilane, and tetramethylguanidylpropyltris(trimethylsiloxy)silane are preferably used.

Component (C) is used in an amount of 0.01 to 20 parts by weight, preferably 0.1 to 5 parts by weight, relative to 100 parts by weight of component (A). Less than 0.01 part by weight of component (C) is ineffective for cure whereas more than 20 parts by weight is uneconomical and may detract from storage stability of the composition.

[Component (D)]

Component (D) is an organic peroxide selected from peroxy ketals, hydroperoxides, dialkyl peroxides, diacyl peroxides, peroxy esters, and peroxy dicarbonates. The organic peroxide decomposes under certain conditions to produce a free radical, may be used alone or in combination of two or more, and serves as a curing initiator for improving the deep section cure of the silicone composition.

Preferred examples of the peroxide used herein include peroxy ketals such as 1,1-di(t-butylperoxy)cyclohexane and 2,2-di(4,4-di-(t-butylperoxy)cyclohexyl)propane; hydroperoxides such as p-menthanehydroperoxide and diisopropylbenzenehydroperoxide; dialkyl peroxides such as dicumyl peroxide and t-butyl cumyl peroxide; diacyl peroxides such as dibenzoyl peroxide and disuccinic acid peroxide; peroxy esters such as t-butylperoxy acetate and t-butylperoxy benzoate; and peroxy dicarbonates such as diisopropylperoxy dicarbonate. Inter alia, peroxy ketals, hydroperoxides, dialkyl peroxides, and peroxy esters which have relatively high decomposition temperature are preferably used from the standpoints of handling and shelf stability. The organic peroxides may be diluted with suitable organic solvents, hydrocarbons, liquid paraffins or inert solid materials prior to use.

Component (D) is used in an amount of 0.01 to 10 parts by weight, preferably 0.1 to 5 parts by weight, relative to 100 parts by weight of component (A). Less than 0.01 part by weight of component (D) is less effective for improving deep section curing properties. More than 10 parts by weight of component (D) may detract from shelf stability and leave large amounts of decomposed residues which incur cracking/slipping during heat exposure.

[Component (E)]

Component (E) is a heat-conductive filler having a thermal conductivity of at least 10 W/m-K. The fillers may be used alone or in combination of two or more. The heat-conductive filler as component (E) is utilized to impart heat conductivity to the silicone composition. Any fillers having a thermal conductivity of at least 10 W/m-K may be used. The upper limit of thermal conductivity is not critical, but is typically about 500 W/m-K. Examples of the filler having a thermal conductivity of at least 10 W/m-K, preferably at least 15 W/m-K include aluminum oxide powder, aluminum powder, copper powder, silver powder, nickel powder, gold powder, zinc oxide powder, magnesium oxide powder, diamond power, and carbon powder. Inter alia, aluminum oxide powder, aluminum powder, and zinc oxide powder are preferred, with the aluminum oxide powder being more preferred.

Preferably the heat-conductive filler has an average particle size in the range of 0.1 to 300 μm, and more preferably 0.1 to 200 μm for the reason that if the average particle size is less than 0.1 μm, the silicone composition may lose grease nature and become less spreadable, and if the average particle size exceeds 300 μm, the silicone composition may lose uniformity. The filler may have any desired shape including irregular and spherical shapes. The average particle size may be determined as a weight-average value or median diameter measured by the laser diffraction method.

Component (E) is used in an amount of 100 to 8,000 parts by weight, preferably 200 to 6,000 parts by weight, relative to 100 parts by weight of component (A). The amount of component (E) in the range provides the silicone composition with sufficient heat conduction and spreadability.

To the silicone composition of the invention, (F) an organopolysiloxane having the general formula (3) may be further included.

[Chem. 4]

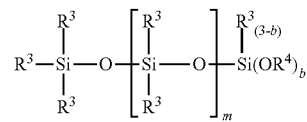

(3)

Herein $R^3$ is each independently an unsubstituted or halogen or cyano-substituted monovalent hydrocarbon group, $R^4$ is each independently an alkyl, alkoxyalkyl, alkenyl or acyl group, m is an integer of 2 to 100, and b is an integer of 1 to 3. The organopolysiloxanes may be used alone or in combination of two or more. Component (F) plays the role of assisting in heavy loading of the heat-conductive filler as component (E).

In formula (3), $R^3$ is each independently an unsubstituted or halogen or cyano-substituted monovalent hydrocarbon group, preferably having 1 to 10 carbon atoms, more preferably 1 to 6 carbon atoms, and even more preferably 1 to 3 carbon atoms. Examples include linear alkyl, branched alkyl, cycloalkyl, alkenyl, aryl, aralkyl, haloalkyl, and cyanoalkyl groups. Exemplary linear alkyl groups include methyl, ethyl, propyl, hexyl, and octyl. Exemplary branched alkyl groups include isopropyl, isobutyl, t-butyl, and 2-ethylhexyl. Exemplary cycloalkyl groups include cyclopentyl and cyclohexyl. Exemplary alkenyl groups include vinyl and allyl. Exemplary aryl groups include phenyl and tolyl. Exemplary aralkyl groups include 2-phenylethyl and 2-methyl-2-phenylethyl. Exemplary haloalkyl groups include 3,3,3-trifluoropropyl, 2-(nonafluorobutyl)ethyl, and 2-(heptadecafluorooctyl)ethyl. Exemplary of the cyanoalkyl group is cyanoethyl. Preferably $R^3$ is methyl, phenyl or vinyl.

$R^4$ is each independently an alkyl, alkoxyalkyl, alkenyl or acyl group. Examples of the alkyl group include linear alkyl, branched alkyl, and cycloalkyl groups as exemplified above for $R^3$. Examples of the alkoxyalkyl group include methoxyethyl and methoxypropyl. Examples of the acyl group include acetyl and octanoyl. Preferably $R^4$ is alkyl, and more preferably methyl or ethyl.

The subscript m is an integer of 2 to 100, preferably 5 to 80, and b is an integer of 1 to 3, preferably equal to 3.

Component (F) preferably has a viscosity at 25° C. of 0.005 to 100 Pa-s, and more preferably 0.005 to 50 Pa s. If the viscosity is less than 0.005 Pa s, the cured composition is susceptible to oil bleeding and sagging. If the viscosity exceeds 100 Pa-s, the resultant composition becomes less flowable, which may be detrimental to coating operation.

Preferred examples of component (F) are given below.

[Chem. 5]

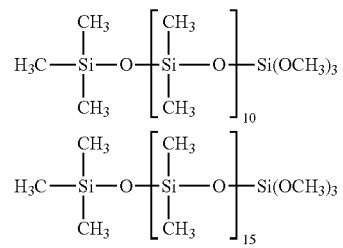

-continued

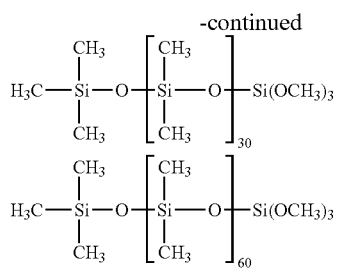

If used, component (F) is blended in an amount of 1 to 400 parts by weight, preferably 10 to 200 parts by weight, relative to 100 parts by weight of component (A). If the amount is too small, loading of the heat-conductive filler as component (E) may be difficult. If the amount is too large, the cured composition may be susceptible to oil bleeding and curing reaction proceeds short.

To the silicone composition of the invention, (G) at least one compound selected from a silane compound having a group bonded to a silicon atom via a carbon atom and selected from the group consisting of an amino, epoxy, mercapto, acryloyl, and methacryloyl group, and a silicon-bonded hydrolyzable group and a partial hydrolytic condensate thereof may be further added. This component has the function of enhancing the adhesion between the inventive silicone composition and a substrate surface onto which the composition is coated.

When the silane compound or partial hydrolytic condensate thereof has at least two functional groups, they may be bonded to a silicon atom via different carbon atoms or via a common carbon atom. Preferably the silane compound or partial hydrolytic condensate thereof has 1 to 3 hydrolyzable groups, and more preferably 2 to 3 hydrolyzable groups.

Examples of the hydrolyzable group are as illustrated for the hydrolyzable group X in formula (2) of component (B). Among others, alkoxy is preferred.

Illustrative examples of the silane compound include amino-containing silanes such as 3-aminopropyldimethoxymethylsilane, 3-aminopropyltrimethoxysilane, 3-aminopropyltriethoxysilane, 3-(2-aminoethylamino)propyldimethoxymethylsilane, 3-(2-aminoethylamino)propyltrimethoxy silane, 2-aminoethylaminomethyldimethoxymethylsilane, and 2-aminoethylaminomethyltrimethoxysilane; mercapto-containing silanes such as γ-mercaptopropyltrimethoxysilane, γ-mercaptopropyltriethoxysilane, γ-mercaptopropylmethyldimethoxysilane, and γ-mercaptopropylmethyldiethoxysilane; epoxy-containing silanes such as 3-glycidoxypropyltrimethoxysilane, 3-glycidoxypropyldimethoxymethylsilane, 3-glycidoxyethyltrimethoxysilane, and 3-glycidoxyethyldimethoxymethylsilane; and (meth)acryloyl-containing silanes such as methacryloxypropyltrimethoxysilane, methacryloxypropyltriethoxysilane, methacryloxypropylmethyldimethoxysilane, acryloxypropyltrimethoxysilane, and acryloxypropyltriethoxysilane. As component (G), the silane compounds may be used alone or in combination of two or more.

If used, component (G) is preferably blended in an amount of 0.01 to 30 parts by weight, more preferably 0.1 to 20 parts by weight, relative to 100 parts by weight of component (A). Less than 0.01 part by weight of component (G) may be less effective for adhesion. More than 30 parts by weight of component (G) may achieve no further improvement in adhesion and be uneconomical.

In addition to the foregoing components, other additives may be added to the silicone composition as long as the objects of the invention are not compromised. Exemplary additives include unreactive organo(poly)siloxanes such as methylpolysiloxane for adjusting hardness and viscosity of the silicone composition, well-known antioxidants such as 2,6-di-t-butyl-4-methylphenol for preventing deterioration of the silicone composition, reinforcing or non-reinforcing fillers such as calcium carbonate, and thixotropy enhancing agents such as polyethers. If necessary, colorants such as pigments and dyes may be added.

[Preparation Method]

The method for preparing the inventive silicone composition is described below although the method is not limited thereto. The method for preparing the silicone composition is not particularly limited as long as it includes the step of mixing the above-mentioned components (A) to (E) and optionally components (F), (G), and other components, that is, may accord with the conventional method for preparing silicone grease compositions. For example, the method includes mixing the above-mentioned components (A) to (E) and optionally components (F), (G), and other components on a mixer such as THINKY MIXER (registered trademark of Thinky Corp.), Trimix, Twinmix, or Planetary Mixer (all registered trademark of mixers manufactured by Inoue Mfg., Inc.), Ultramixer (registered trademark of a mixer manufactured by Mizuho Industrial Co., Ltd.), or HIVIS DISPER MIX (registered trademark of a mixer manufactured by Tokushu Kika Kogyo Co., Ltd.) or by manual mixing with a spatula.

The inventive silicone composition should preferably have a viscosity of 3 to 1,000 Pa-s, and more preferably 10 to 500 Pas as measured at 25° C. If the viscosity is less than 3 Pa s, working efficiency may be decreased, for example, shape retention may be difficult. If the viscosity exceeds 1,000 Pa s, working efficiency may also be decreased, for example, dispensing and coating operations may be difficult. The above viscosity can be achieved by adjusting the relative amounts of the above-mentioned components. Notably the viscosity is a value measured at 25° C. by a Malcolm viscometer (using rotor type A at a speed of 10 rpm and a shear rate of 6 $s^{-1}$).

The inventive silicone composition typically has a thermal conductivity of 0.5 to 10 W/m-K.

The cured product of the inventive silicone composition has a hardness of preferably 5 to 90, more preferably 10 to 85, as measured by an Asker C Durometer.

The inventive silicone composition eliminates not only a need for refrigeration or freezing during storage, but also a need for heating/cooling in a curing step in its application since it cures at room temperature when allowed to stand in moist atmosphere. An increased manufacturing efficiency is thus available. In addition, the concurrent use of organic peroxide enables to prevent a cured product from deteriorating owing to hardness changes and cracking/slipping upon heat exposure and thermal cycling, and to prevent heat dissipating properties from being degraded under application of thermal loads. These properties render the composition useful in a wide variety of fields requiring heat dissipation and heat resistance such as electric/electronic and transportation fields.

EXAMPLES

The invention is specifically described below with reference to Examples and Comparative Examples, but not limited thereto.

First there were furnished the following components, from which silicone compositions of the invention were prepared.

[Component (A)]
A-1: dimethylpolysiloxane capped with hydroxyl at both ends and having a viscosity of 0.7 Pa-s at 25° C.

[Component (B)]
B-1: phenyltri(isopropenoxy)silane

[Chem. 6]

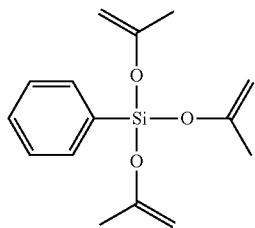

B-2: vinyltri(isopropenoxy)silane

[Chem. 7]

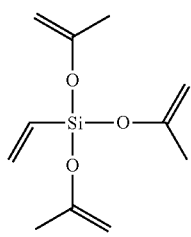

[Component (C)]
C-1: tetramethylguanidylpropyltrimethoxysilane

[Chem. 8]

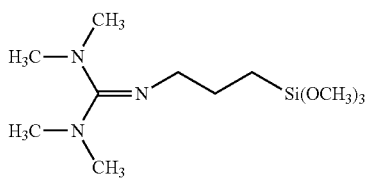

[Component (D)]
D-1: 1,1-di(t-butylperoxy)cyclohexane

[Chem. 9]

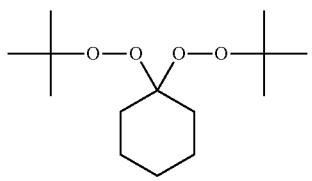

[Component (E)]
E-1: aluminum oxide powder with an average particle size of 40 μm (thermal conductivity: 27 W/m-K)
E-2: aluminum oxide powder with an average particle size of 1.0 μm (thermal conductivity: 27 W/m-K)

[Component (F)]
F-1: organopolysiloxane of the following formula

[Chem. 10]

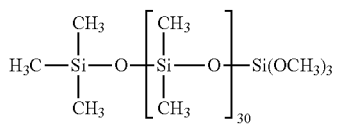

[Component (G)]
G-1: 3-aminopropyltriethoxysilane

[Chem. 11]

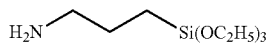

[Other component (H)]
H-1: dimethylpolysiloxane capped with trimethylsilyl at both ends and having a viscosity of 0.1 Pa s at 25° C.

Examples 1 to 5 and Comparative Examples 1 to 6

Preparation of Silicone Compositions

Silicone compositions were prepared by mixing the foregoing components (A) to (E) and optionally components (F), (G), and other component (H) in the amounts shown in Tables 1 and 2 according to the following procedure. Specifically, a 5-liter Planetary Mixer (Inoue Mfg., Inc.) was charged with components (A), (E), (F), and (H), which were mixed at 130° C. for 3 hours. The mixture was cooled to room temperature, to which components (B), (C), (D), and (G) were added. The mixture was uniformly mixed to give a silicone composition. Each of the compositions thus obtained was measured for viscosity and heat conductivity, and the cured product thereof measured for hardness and hardness change, by the test methods described below. In addition, hardness change upon 160° C. heat exposure, and resistance to cracking/slipping upon 160° C. heat exposure and thermal cycling between −40° C./30 minutes and 160° C./30 minutes were evaluated. The results are shown in Tables 1 and 2.

[Viscosity]
An absolute viscosity of each composition was measured at 25° C. by a Malcolm viscometer (type PC-1T).

[Thermal Conductivity]
Each composition was wrapped with food wrap and measured for thermal conductivity by TPA-501 (Kyoto Electronics Manufacturing Co., Ltd.).

[Hardness and Hardness Change]
Each composition was shaped into sheets of 2.0 mm thick, which were allowed to stand at 23±2° C. and 50±5% RH for 7 days, and a laminate of 6 sheets was measured by an Asker C Durometer. After the hardness measurement, the sheets were further held in 160° C. environment for 500 hours, following which hardness was measured by Asker C Durometer.

[Cracking/Slipping Test]
Each composition, 0.2 mL, was coated on a glass plate and overlaid with another glass plate via a spacer of 1.0 mm, and the assembly was secured by a clip. The assembly was subjected to test (1) of allowing to stand at 23±2° C. and 50±5% RH for 7 days, and then keeping horizontally at 160° C. for 500 hours, and test (2) of placing vertically and thermal cycling between −40° C./30 minutes and 160° C./30 minutes over 500 cycles. Each specimen was observed for cracks or slipping.

TABLE 1

| Formulation (parts by weight) | | Example | | | | |
|---|---|---|---|---|---|---|
| | | 1 | 2 | 3 | 4 | 5 |
| (A) | A-1 | 100 | 100 | 100 | 100 | 100 |
| (B) | B-1 | 11.3 | 11.3 | 11.3 | — | 11.3 |
| | B-2 | — | — | — | 9.2 | — |
| (C) | C-1 | 2.5 | 2.5 | 2.5 | 2.5 | 2.5 |
| (D) | D-1 | 3.8 | 3.8 | 1.9 | 3.8 | 3.8 |
| (E) | E-1 | 1,688 | 1,688 | 1,688 | 1,688 | 1,688 |
| | E-2 | 1,125 | 1,125 | 1,125 | 1,125 | 1,125 |
| (F) | F-1 | 75 | 75 | 75 | 75 | 150 |
| (G) | G-1 | — | 2.5 | — | — | — |
| (H) | H-1 | 75 | 75 | 75 | 75 | — |
| Total of component (E) | | 2,813 | 2,813 | 2,813 | 2,813 | 2,813 |
| Test results | | | | | | |
| Viscosity (Pa · s) | | 50 | 52 | 54 | 60 | 35 |
| Thermal conductivity (W/m · K) | | 3.4 | 3.3 | 3.5 | 3.4 | 3.4 |
| Hardness: initial | | 56 | 60 | 56 | 65 | 50 |
| Hardness: 160° C./500 hours | | 36 | 48 | 33 | 44 | 34 |
| Cracking/slipping: (1) 160° C./500 hours | | not observed | not observed | not observed | not observed | not observed |
| Cracking/slipping: (2) −40° C./30 min ↔ 160° C./30 min, 500 cycles | | not observed | not observed | not observed | not observed | not observed |

TABLE 2

| Formulation (parts by weight) | | Comparative Example | | | | | |
|---|---|---|---|---|---|---|---|
| | | 1 | 2 | 3 | 4 | 5 | 6 |
| (A) | A-1 | 100 | 100 | 100 | 100 | 100 | 100 |
| (B) | B-1 | 11.3 | 11.3 | 11.3 | 11.3 | 11.3 | 11.3 |
| | B-2 | — | — | — | — | — | — |
| (C) | C-1 | 2.5 | 2.5 | 2.5 | — | 25 | 2.5 |
| (D) | D-1 | — | — | 3.8 | 3.8 | 3.8 | 15 |
| (E) | E-1 | 1,688 | 1,688 | 5,000 | 1,688 | 1,688 | 1,688 |
| | E-2 | 1,125 | 1,125 | 3,332 | 1,125 | 1,125 | 1,125 |
| (F) | F-1 | 75 | 75 | 300 | 75 | 75 | 75 |
| (G) | G-1 | — | 2.5 | — | — | — | — |
| (H) | H-1 | 75 | 75 | — | 75 | 75 | 75 |
| Total of component (E) | | 2,813 | 2,813 | 8,332 | 2,813 | 2,813 | 2,813 |
| Test results | | | | | | | |
| Viscosity (Pa · s) | | 71 | 73 | not become greasy | 45 | putty form (unmeasurable) | 54 |
| Thermal conductivity (W/m · K) | | 3.4 | 3.4 | | 3.4 | | 3.3 |
| Hardness: initial | | 49 | 53 | | not cured | | 60 |
| Hardness: 160° C./500 hours | | 54 | 59 | | | | 46 |
| Cracking/slipping: (1) 160° C./500 hours | | observed | observed | | | | observed |
| Cracking/slipping: (2) −40° C./30 min ↔ 160° C./30 min, 500 cycles | | observed | observed | | | | observed |

The silicone composition of the invention eliminates not only a need for refrigeration or freezing during storage, but also a need for heating/cooling steps in its application since it cures at room temperature when allowed to stand in moist atmosphere. The results in Tables 1 and 2 reveal that blending a specific amount of organic peroxide as component (D) is successful in improving deep section cure and preventing a cured product from deteriorating owing to hardness changes and cracking/slipping upon heat exposure and thermal cycling.

The invention is not limited to the forgoing embodiments. The embodiments are for illustrative purpose only, and any embodiment which has substantially the same constitution as the technical ideas set forth in the claims and which exerts equivalent functions and results is included within the technical scope of the invention.

The invention claimed is:
1. A silicone composition relying on both condensation curing reaction and organic peroxide curing reaction, comprising as essential components,
(A) 100 parts by weight of an organopolysiloxane capped with hydroxyl at both ends and represented by the general formula (1):

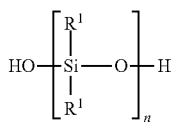

(1)

wherein $R^1$ is each independently an unsubstituted or halogen or cyano-substituted $C_1$-$C_5$ alkyl or $C_6$-$C_8$ aryl group, and n is such a number that the organopolysiloxane of formula (1) may have a viscosity at 25° C. of the value defined below, the organopolysiloxane having a viscosity at 25° C. of 0.1 to 1,000 Pa·s, (B) 1 to 40 parts by weight of at least one compound selected from a silane compound represented by the general formula (2):

$$R^2_a\text{---}SiX_{(4-a)}$$ (2)

wherein $R^2$ is an unsubstituted or halogen or cyano-substituted $C_1$-$C_3$ alkyl, vinyl, or phenyl group, X is a hydrolyzable group, and a is 0 or 1, a (partial) hydrolysate and a (partial) hydrolytic condensate thereof, (C) 0.01 to 20 parts by weight of a condensation catalyst selected from alkyltin ester compounds, titanic acid esters, titanium chelate compounds, organozinc compounds, organoiron compounds, organocobalt compounds, organomanganese compounds, organoaluminum compounds, hexylamine, dodecylamine phosphate, quaternary ammonium salts, alkali metal salts of lower fatty acids, dialkylhydroxylamines, and guanidyl-containing silanes and siloxanes, (D) 0.01 to 10 parts by weight of an organic peroxide selected from peroxy ketals, hydroperoxides, dialkyl peroxides, diacyl peroxides, peroxy esters, and peroxy dicarbonates, (E) 100 to 8,000 parts by weight of a heat-conductive filler having a thermal conductivity of at least 10 W/m·K, and (F) an organopolysiloxane represented by the general formula (3):

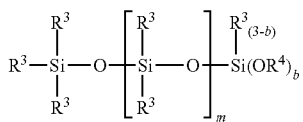

(3)

wherein $R^3$ is each independently an unsubstituted or halogen or cyano-substituted monovalent hydrocarbon group, $R^4$ is each independently an alkyl, alkoxyalkyl, alkenyl, or acyl group, m is an integer of 2 to 100, and b is an integer of 1 to 3, in an amount of 75 to 400 parts by weight per 100 parts by weight of component (A).

2. The silicone composition of claim 1, further comprising (G) at least one compound selected from a silane compound having a group bonded to a silicon atom via a carbon atom and selected from the group consisting of an amino, epoxy, mercapto, acryloyl, and methacryloyl group, and a silicon-bonded hydrolyzable group and a partial hydrolytic condensate thereof, in an amount of 0.01 to 30 parts by weight per 100 parts by weight of component (A).

3. The silicone composition of claim 1, wherein X in formula (2) is an alkenyloxy group.

4. The silicone composition of claim 1, wherein component (C) is selected from the group consisting of tetramethylguanidylpropyltrimethoxysilane, tetramethylguanidylpropylmethyldimethoxysilane, and tetramethylguanidylpropyltris(trimethylsiloxy)silane.

5. The silicone composition of claim 1, component (D) is selected from the group consisting of 1,1-di(t-butylperoxy)cyclohexane, 2,2-di(4,4-di-(t-butylperoxy)cyclohexyl)propane; p-menthanehydroperoxide, diisopropylbenzenehydroperoxide; dicumyl peroxide, t-butyl cumyl peroxide; dibenzoyl peroxide, disuccinic acid peroxide; t-butylperoxy acetate, t-butylperoxy benzoate; and diisopropylperoxy dicarbonate.

6. The silicone composition of claim 1, which cures at room temperature in moist atmosphere.

7. The silicone composition of claim 1, wherein component (A) is a dimethylpolysiloxane capped with hydroxyl at both ends and having a viscosity of 0.7 Pa-s at 25° C.

8. The silicone composition of claim 1, wherein component (B) is selected from the group consisting of phenyltri(isopropenoxy)silane, vinyltri(isopropenoxy)silane, and combinations thereof.

9. The silicone composition of claim 1, wherein component (E) is selected from the group consisting of an aluminum oxide powder with an average particle size of 40 μm (thermal conductivity: 27 W/m-K), an aluminum oxide powder with an average particle size of 1.0 μm (thermal conductivity: 27 W/m-K), and combinations thereof.

10. The silicone composition of claim 1, wherein component (F) is an organopolysiloxane of the following formula:

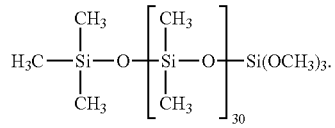

11. The silicone composition of claim 1, wherein component (G) is 3-aminopropyltriethoxysilane.

12. The silicone composition of claim 1, wherein component (H) is a dimethylpolysiloxane capped with trimethylsilyl at both ends and having a viscosity of 0.1 Pa s at 25° C.

13. The silicone composition of claim 1, wherein the composition is cured to form a cured composition, and wherein the cured composition does not exhibit cracking/slipping upon standing at 23±2° C. and 50±5% RH for 7 days, followed by keeping horizontal at 160° C. for 500 hours.

14. The silicone composition of claim 1, wherein the composition is cured to form a cured composition, and wherein the cured composition does not exhibit cracking/slipping upon placing vertically and thermal cycling between 40° C./30 minutes and 160° C./30 minutes over 500 cycles.

15. The silicone composition of claim 1, wherein the composition further comprises an unreactive organo(poly)siloxane.

16. The silicone composition of claim 1, wherein the composition further comprises at least one additive selected from the group consisting of antioxidants, reinforcing or non-reinforcing fillers, thixotropy enhancing agents, colorants, and combinations thereof.

17. The silicone composition of claim 16, wherein the antioxidant is 2,6-di-t-butyl-4-methylphenol.

18. The silicone composition of claim 16, wherein the reinforcing or non-reinforcing filler is calcium carbonate.

19. The silicone composition of claim 16, wherein the thixotropy enhancing agent is a polyether.

* * * * *